(12) United States Patent
Buggy

(10) Patent No.: US 11,396,864 B2
(45) Date of Patent: Jul. 26, 2022

(54) CONDITION MONITORING AND CONTROLLING OF HEATING ELEMENTS IN WIND TURBINES

(71) Applicant: VESTAS WIND SYSTEMS A/S, Aarhus N (DK)

(72) Inventor: Stephen Buggy, Cowes (GB)

(73) Assignee: VESTAS WIND SYSTEMS A/S, Aarhus N (DK)

( * ) Notice: Subject to any disclaimer, the term of this patent is extended or adjusted under 35 U.S.C. 154(b) by 443 days.

(21) Appl. No.: 16/089,113

(22) PCT Filed: Mar. 30, 2017

(86) PCT No.: PCT/DK2017/050098
§ 371 (c)(1),
(2) Date: Sep. 27, 2018

(87) PCT Pub. No.: WO2017/167347
PCT Pub. Date: Oct. 5, 2017

(65) Prior Publication Data
US 2020/0300226 A1    Sep. 24, 2020

(30) Foreign Application Priority Data
Mar. 31, 2016  (DK) .............................. PA201670181

(51) Int. Cl.
| F03D 17/00 | (2016.01) |
| F03D 80/40 | (2016.01) |
| G01R 27/08 | (2006.01) |

(52) U.S. Cl.
CPC ............. F03D 17/00 (2016.05); F03D 80/40 (2016.05); G01R 27/08 (2013.01)

(58) Field of Classification Search
CPC ...... F03D 17/00; F03D 80/40; F03D 11/0025; F03D 7/042; F03D 7/0264; G01R 27/08
See application file for complete search history.

(56) References Cited

U.S. PATENT DOCUMENTS

| 3,984,611 A | 10/1976 | Varrasso |
| 5,925,275 A | 7/1999 | Lawson et al. |

(Continued)

FOREIGN PATENT DOCUMENTS

| CN | 102608381 A | 7/2012 |
| CN | 103558448 A | 2/2014 |

(Continued)

OTHER PUBLICATIONS

English translation of CN105182137A (Year: 2015).*

(Continued)

Primary Examiner — Woody A Lee, Jr.
Assistant Examiner — Wesley Le Fisher
(74) Attorney, Agent, or Firm — Patterson + Sheridan, LLP

(57) ABSTRACT

Examples are generally directed to techniques for monitoring and controlling heating elements in wind turbine blades and the wind turbine blades. One example of the present disclosure is a method of monitoring and controlling a condition of a heating element in a wind turbine blade and the wind turbine blade. The method includes measuring a voltage applied to the heating element and measuring the current flowing through the heating element. The method further includes calculating a resistance of the heating element using the measured voltage and the measured current and storing the resistance in a database. The method further includes determining whether an event corresponding to a failure of the wind turbine blade or the heating element in the wind turbine blade has occurred. When the event occurs, control of the heating element is adjusted.

20 Claims, 7 Drawing Sheets

(56) References Cited

U.S. PATENT DOCUMENTS

| | | | |
|---|---|---|---|
| 6,145,787 A | | 11/2000 | Rolls |
| 6,227,492 B1 * | | 5/2001 | Schellhase ............. B64D 15/12 |
| | | | 244/134 D |
| 6,525,518 B1 * | | 2/2003 | Garnaes ................ F03D 7/0296 |
| | | | 324/76.13 |
| 9,415,875 B2 * | | 8/2016 | Stiesdal ................. B64D 15/12 |
| 9,476,407 B2 * | | 10/2016 | Pineda Amo ......... F03D 7/0224 |
| 10,470,252 B2 * | | 11/2019 | Lindskog ............ B32B 38/0036 |
| 2012/0029853 A1 | | 2/2012 | Baumheinrich et al. |
| 2013/0035878 A1 | | 2/2013 | Wesby et al. |
| 2014/0072429 A1 * | | 3/2014 | Krainer ................... F03D 80/40 |
| | | | 416/1 |
| 2014/0127017 A1 * | | 5/2014 | Virtanen ................ H05B 6/105 |
| | | | 416/95 |
| 2014/0199170 A1 * | | 7/2014 | Madsen .................. B23P 15/04 |
| | | | 416/95 |
| 2014/0255151 A1 * | | 9/2014 | Jensen ...................... F03D 1/04 |
| | | | 415/121.3 |
| 2015/0283653 A1 | | 10/2015 | Krueger et al. |
| 2016/0338151 A1 * | | 11/2016 | Lindskog ............... B32B 37/025 |
| 2017/0034874 A1 * | | 2/2017 | Faulkner ................. H01L 21/00 |

FOREIGN PATENT DOCUMENTS

| | | | |
|---|---|---|---|
| CN | 105182137 A | * | 12/2015 |
| CN | 105182137 | | 7/2018 |
| EP | 3095296 A1 | | 11/2016 |
| EP | 3436698 A1 | | 2/2019 |
| GB | 2477338 A | | 8/2011 |
| WO | 9853200 A1 | | 11/1998 |
| WO | 2011/096851 A1 | | 8/2011 |
| WO | 2011126517 A2 | | 10/2011 |
| WO | 2011127997 A1 | | 10/2011 |
| WO | 2015156851 A2 | | 10/2015 |
| WO | 2017167347 A1 | | 10/2017 |

OTHER PUBLICATIONS

Chinese Office Action for Application No. 201780020923.5 dated Mar. 5, 2020.

Chinese Office Action for Application No. 201780020923.5 dated Jul. 24, 2019.

European Patent Office Communication of a Notice of Opposition for Application No. 17715906.8-1007/3436698 dated Oct. 27, 2020.

Ciang, Chia Chen et al., "Structural Health Monitoring for a wind turbine system: a review of damage detection methods," Meas. Sci. Technol., vol. 19, No. 122001, Oct. 13, 2008.

Todoroki, Akira et al., "Strain and Damage Monitoring of CFRP Laminates by Means of Electrical Resistance Measurement," Journal of Solid Mechanics and Materials Engineering, vol. 1, No. 8, 2007.

Starke, Peter et al., "Resistivity—a characteristic fingerprint of fatigue induced changes in the microstructure of metallic materials," ScienceDirect, vol. 10, 2011.

Hau, Erich, "Windkraftanlagen," Springer, 2002, Ed 3.

PCT Written Opinion of the International Searching Authority for Application No. PCT/DK2017/050098 dated Mar. 31, 2016.

Danish Patent and Trademark Office 1st Technical Examination for Application No. PA 2016 70181 dated Nov. 11, 20016.

PCT International Search Report for Application No. PCT/DK2017/050098 dated Mar. 31, 2016.

Tang, W. Chapter 9: Testing and Condition Monitoring of Composite Wind Turbine Blades, in book: Recent Advances in Composite Materials for Wind Turbines Blades, [online], (2013), [retrieved on Sep. 11, 2016]. Retrieved from <http://www.academicpub.org/amsa/chapterInfo.aspx> p. 164, lines 4-8, Fig. 28.

L. Cheng et al., Pulsed Electromagnetic NDE for Defect Detection and Characterisation in Composites, IEEE International Instrumentation and Measurement Technology Conference (12MTC), p. 1902-1907, (2012), ISBN: 9781457717710.

* cited by examiner

CONDITION MONITORING AND CONTROLLING OF HEATING ELEMENTS IN WIND TURBINES

BACKGROUND

Field

Examples presented in this disclosure generally relate to techniques for monitoring and controlling heating elements in wind turbine blades.

Description of the Related Art

Modern power generation and distribution networks increasingly rely on renewable energy sources, such as wind turbines. In some cases, the wind turbines may be substituted for conventional, fossil fuel-based generators. The formation of ice on the surface of the blades of a wind turbine is a relatively common problem, even in moderate climates. The build-up and spread of ice on the blade surface, in particular on the tip portion of the blade, changes the blade aerodynamics and may also lead to increased vibrations and loading on the blade, all of which lead to a reduction in power output. In more severe cases, the turbine may need to be shut down upon accumulation of ice to prevent excessive loading of the blades, which may damage or prematurely fatigue the blade components.

To prevent ice from accumulating on the blades, the wind turbines have been equipped with heating systems. The typical heating systems prevent the accumulation of ice on blades (anti-icing) and remove the ice from the blades after the ice accumulation (de-icing). A plurality of electro-thermal heat (ETH) panels may be utilized as a heating system. The ETH panels may be embedded in each blade and powered on to prevent ice accumulation. Over time, the ETH panels may begin to fail due to a variety of external conditions, such as lightning strikes, bird strikes, fatigue during operation, or contact with other ambient conditions. The failure of the ETH panels affects the de-icing and anti-icing processes leading to an accumulation of ice on the surface of the blade.

Therefore, there is a need to account for these effects and monitor and control ETH panels.

SUMMARY

One example of the present disclosure is a method of monitoring and controlling a condition of a heating element in a wind turbine blade. The method includes measuring a voltage applied to the heating element and measuring the current flowing through the heating element. The method further includes calculating a resistance of the heating element using the measured voltage and the measured current. The method further includes determining whether an event corresponding to a failure of the wind turbine blade or the heating element in the wind turbine blade has occurred. When the event has occurred, control of the heating element is adjusted.

Another example of the present disclosure relates to a control system for monitoring and controlling heating elements within wind turbine blades. The system includes a processor and memory which stores program code, which, when executed on the processor performs an operation for monitoring and controlling a condition of a heating element in a wind turbine blade. The operation includes measuring a voltage applied to the heating element and measuring the current flowing through the heating element. The operation further includes calculating a resistance of the heating element using the measured voltage and the measured current. The operation further includes determining whether an event corresponding to a failure of the wind turbine blade or the heating element in the wind turbine blade has occurred. When the event has occurred, control of the heating element is adjusted.

Another example of the present disclosure is a computer readable storage medium for monitoring and controlling heating elements within wind turbine blades. The computer readable storage medium has stored thereon instructions that, when executed by a processor, causes the processor to perform a method of monitoring and controlling a heating element in a wind turbine blade. The method includes measuring a voltage applied to the heating element and measuring the current flowing through the heating element. The method further includes calculating a resistance of the heating element using the measured voltage and the measured current. The method further includes determining whether an event corresponding to a failure of the wind turbine blade or the heating element in the wind turbine blade has occurred. When the event has occurred, control of the heating element is adjusted.

BRIEF DESCRIPTION OF THE DRAWINGS

So that the manner in which the above recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

DESCRIPTION OF EXAMPLE EMBODIMENTS

Examples are generally directed to techniques for monitoring and controlling heating elements in wind turbine blades. One example of the present disclosure is a method of monitoring and controlling a condition of a heating element in a wind turbine blade. The method includes measuring a voltage applied to the heating element and measuring the current flowing through the heating element. The method further includes calculating a resistance of the heating element using the measured voltage and the measured. The method further includes determining whether an event corresponding to a failure of the wind turbine blade or the heating element in the wind turbine blade has occurred. When the event has occurred, control of the heating element is adjusted.

Figure 1:
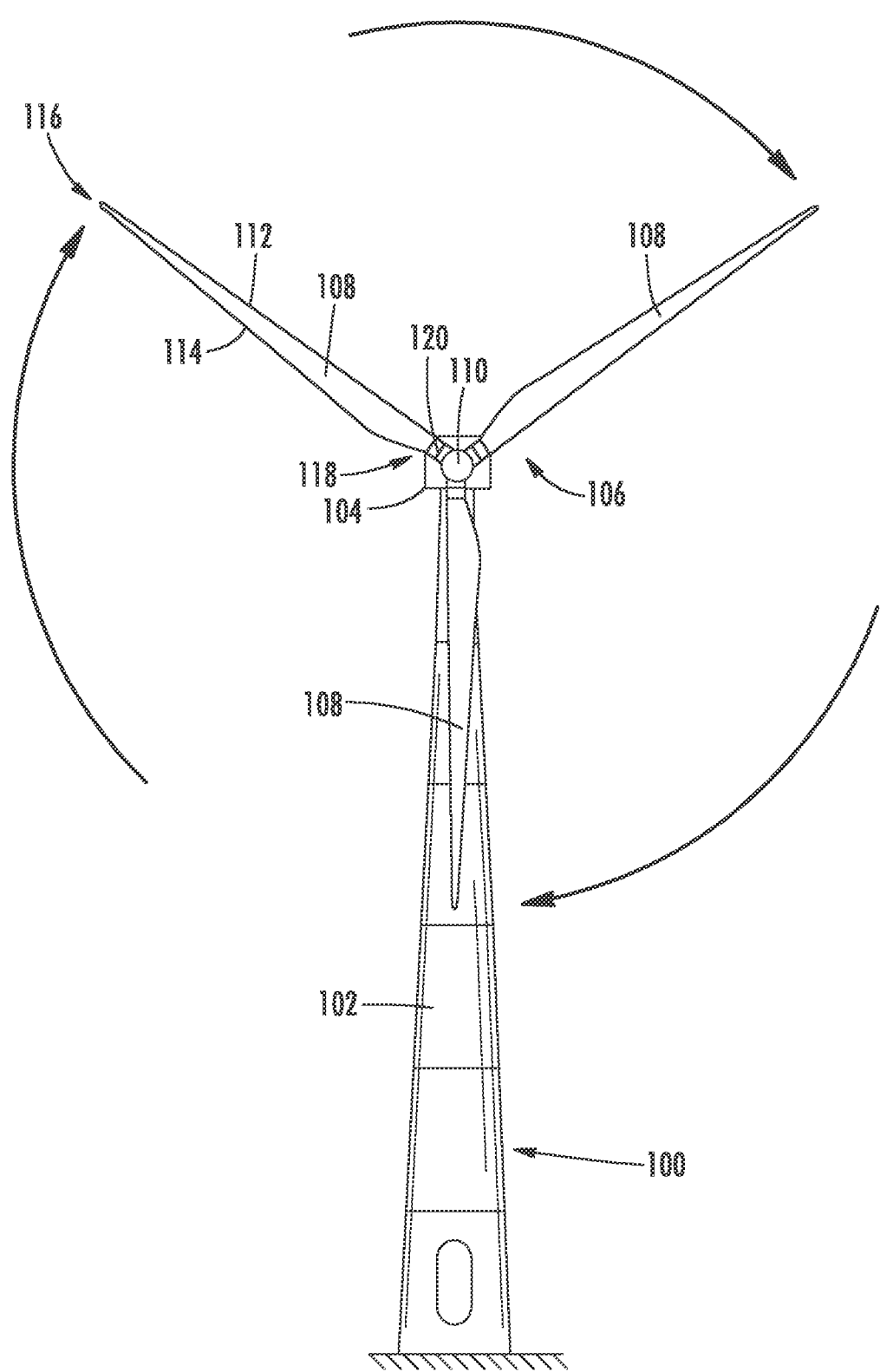
FIG. 1 illustrates a diagrammatic view of a horizontal-axis wind turbine generator (WTG), according to one example.

FIG. 1 illustrates a diagrammatic view of a horizontal-axis wind turbine generator (WTG) 100. The WTG 100 typically includes a tower 102 and a nacelle 104 located at the top of the tower 102. A wind turbine rotor 106 may be connected with the nacelle 104 through a low speed shaft extending out of the nacelle 104. As shown, the wind turbine rotor 106 includes three rotor blades 108 mounted on a common hub 110, but may include any suitable number of blades, such as two, four, five, or more blades. The blade 108 typically has an aerodynamic shape with a leading edge 112 for facing into the wind, a trailing edge 114 at the opposite end of a chord for the blade 108, a tip 116, and a root 118 for attaching to the hub 110 in any suitable manner. For some examples, the blades 108 may be connected to the hub 110 using pitch bearings 120 such that each blade 108 may be rotated around its longitudinal axis to adjust the blade's pitch.

Figure 2:
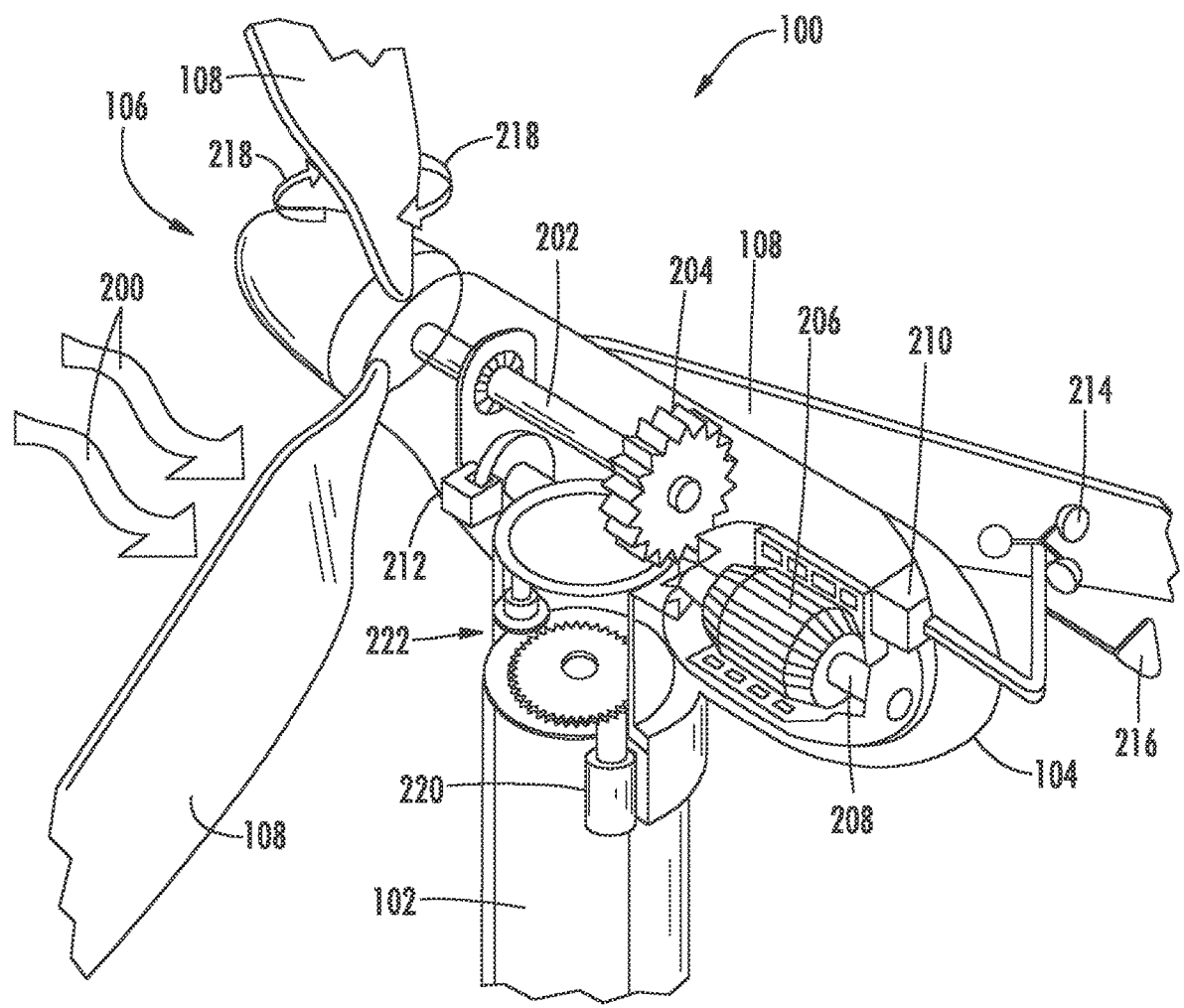
FIG. 2 illustrates a diagrammatic view of typical components internal to the nacelle 104 and tower of the WTG of FIG. 1, according to one example.

FIG. 2 illustrates a diagrammatic view of typical components internal to the nacelle 104 and tower 102 of the WTG 100. When the wind 200 impacts on the blades 108, the rotor 106 spins and rotates a low-speed shaft 202. Gears in a gearbox 204 mechanically convert the low rotational speed of the low-speed shaft 202 into a relatively high rotational speed of a high-speed shaft 208 suitable for generating electricity using a generator 206. The WTG 100 may also include a braking system 212 for emergency shutdown situations and/or to lock the rotor into a required position.

A controller 210 may sense the rotational speed of one or both of the shafts 202, 208. The controller 210 may receive inputs from an anemometer 214 (providing wind speed) and/or a wind vane 216 (providing wind direction). Based on information received, the controller 210 may send a control signal to one or more of the blades 108 in an effort to adjust the pitch 218 of the blades. By adjusting the pitch 218 of the blades with respect to the wind direction, the rotational speed of the rotor (and therefore, the shafts 202, 208) may be increased or decreased. Based on the wind direction, for example, the controller 210 may send a control signal to an assembly comprising a yaw motor 220 and a yaw drive 222 to rotate the nacelle 104 with respect to the tower 102, such that the rotor 106 may be positioned to face more (or, in certain circumstances, less) upwind.

Figure 3:
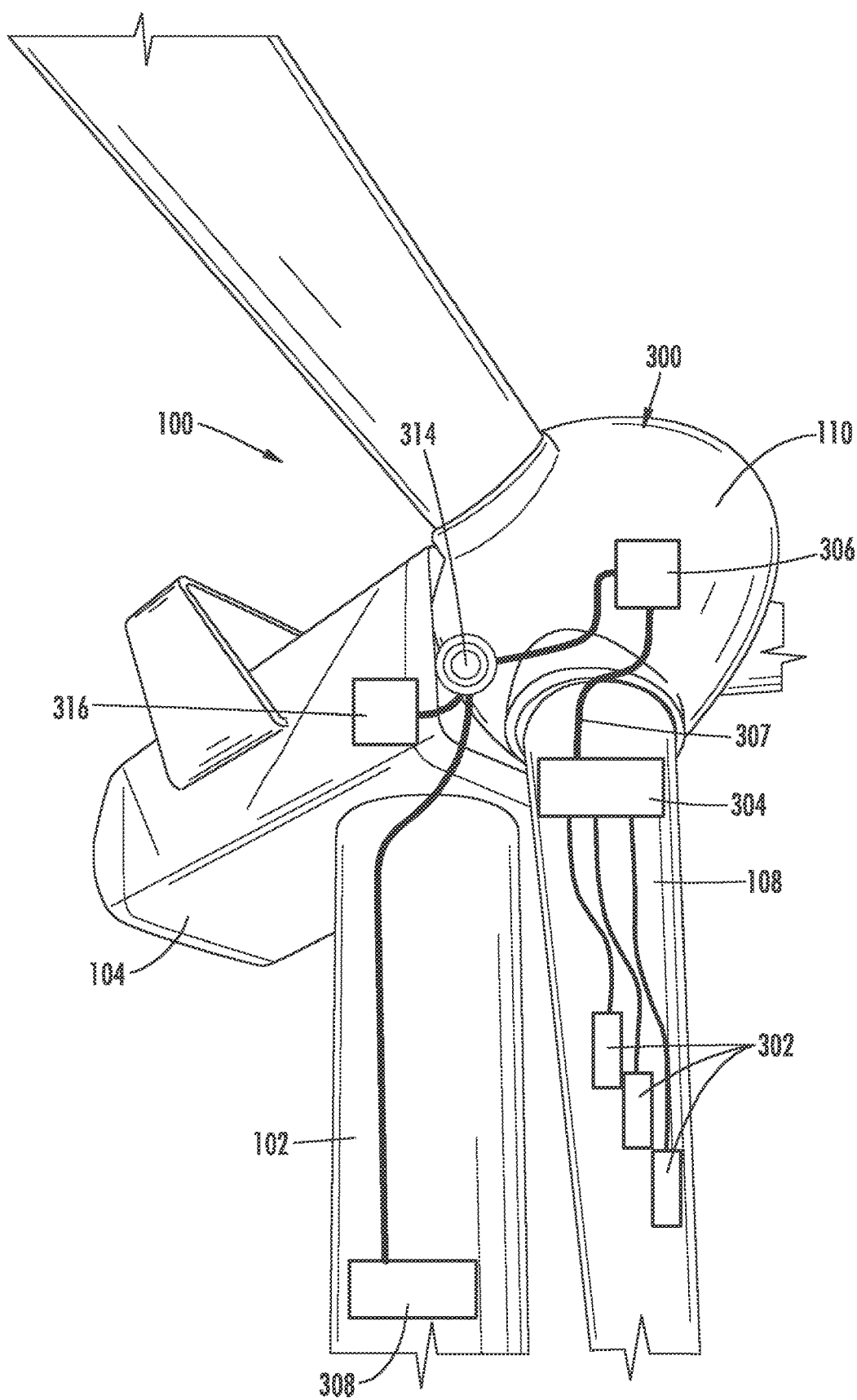
FIG. 3 is a schematic view of a control system for one or more electro-thermal heating (ETH) panels inside the WTG of FIG. 1, according to one example.

In cold climate regions, ice may form on the blades 108, which can reduce the speed of the rotation of the blades 108. In order to maintain an ice free surface on the blades 108, one or more Electro Thermal Heat (ETH) panels may be utilized. FIG. 3 is a schematic view of a control system 300 for one or more ETH panels 302 inside the WTG 100. The control system 300 may include a plurality of blade control and power distribution boxes 304, hub control and power distribution box 306, a slip ring 314, a power source 316, and a system controller 308. The one or more ETH panels 302 may be embedded in each blade 108 and may be controlled by blade control and power distribution boxes 304 located in the root 118 of each blade 108. There may be one blade control and power distribution boxes 304 for each blade 108. In one example, there are up to 32 ETH panels 302 embedded in each blade 108, such as 16 ETH panels 302 covering the windward blade surface and 16 ETH panels 302 covering the leeward blade surface. In one example, the one or more ETH panels 302 cover the entire blade 108 except for the root 118. Electrical power may be supplied to the one or more ETH panels 302 from blade power and distribution box 304 located in the blade root. The blade power and distribution box 304 may include relays for switching on and off the one or more ETH panels 302 in each blade 108. The blade power and distribution box 304 may also include lightning protection components. From the blade power and distribution box 304, power cables are routed to each ETH panel 302. In one example, the WTG 100 includes three blades and three power cables 307, and each power cable 307 connects the hub power and distribution box 306 to a corresponding blade power and distribution box 304 located in a corresponding blade 108.

The hub control and power distribution box 306 may be electrically connected a slip ring 314 located inside the nacelle 104. The slip ring 314 may be electrically connected to a power source 316 located inside the nacelle 104. The power source 316 may include a circuit breaker switch to allow the system to be de-energized. Electrical power may be supplied from the power source 316 through the hub interface of the nacelle 104 via the slip ring 314 and may be supplied to the one or more ETH panels 302 in each blade 108 via the slip ring 314, the hub control and power distribution box 306, and the blade control and power distribution box 304. The control and operation of the control system 300 may be achieved by remote connection via the system controller 308 and communication through the slip ring 314. In one example, the system controller 308 may be a standalone system. In another example, the system controller 308 may be embodied within the turbine controller. The system controller 308 may be connected to the slip ring 314 to allow communication to the hub control and power distribution box 306. Each blade control and power distribution Box 304 may be electrically connected to a communication link through the slip ring 314. Control signals provided to the blade control and power distribution box 304 from the system controller 308 are communicated through the slip ring 314. In one example this may be through a wireless link. In another example this may be through and electrical or optical fibre link.

The control system 300 may utilize duty cycling (i.e., switching on and off relays over a period of time) to achieve power distribution across the one or more ETH panels 302 in each blade 108. During severe icing conditions ideally all of the ETH panels 302 embedded in the blades 108 should be switched on continuously. The slip ring 314 may have a power or current constraint which will restrict the energy drawn from the power source 316 to the ETH Panels 302. To maximize the potential power available to the ETH panels 302, the control system 300 will focus on a fixed and predetermined set of zones having combined energy consumption less than the capabilities of the slip ring 314.

Figure 4A:
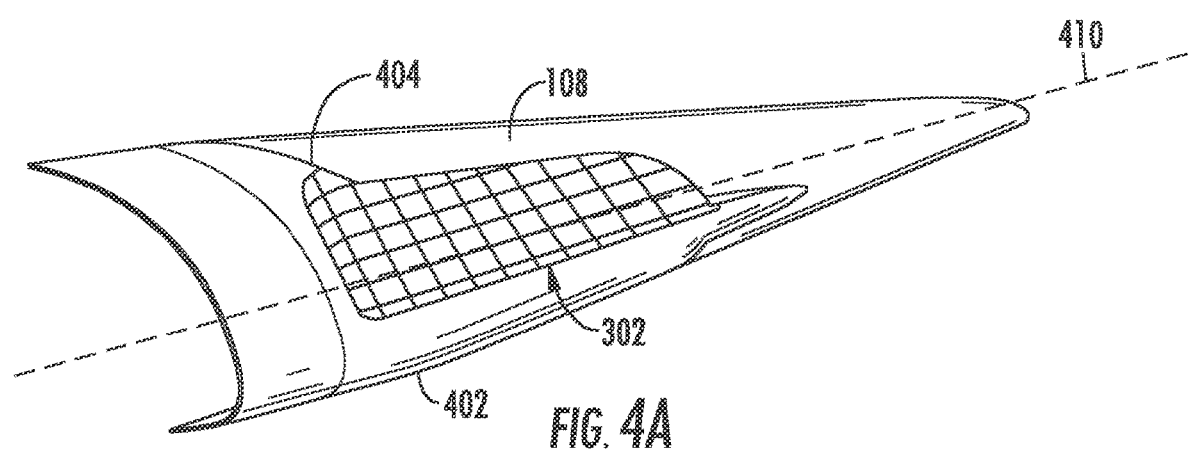
FIGS. 4A-4B are perspective views of the blade of FIG. 1, showing a portion of the embedded ETH panel, according to one example.
Figure 4B:
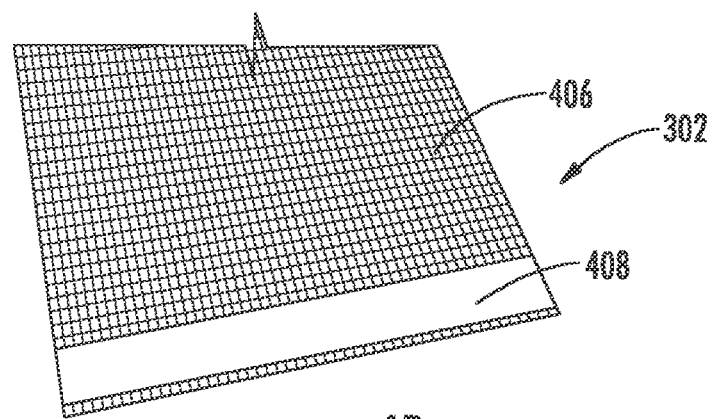

FIG. 4A is a perspective view of the blade 108 showing a portion of the embedded ETH panel 302. As shown, the ETH panel 302 may be embedded in the blade 108, such as between a first layer 402 and a second layer 404 of the blade 108. The ETH panel 302 may be any suitable resistive heating element. In one example, each ETH panel 302 includes a carbon mesh 406 and a busbar 408 disposed across the carbon mesh 406 for supplying power to the carbon mesh 406, as shown in FIG. 4B.

The carbon mesh 406 on the ETH panel 302 has the tendency to degrade over time. The ETH panel 302 may begin to fail as the carbon mesh 406 continues to degrade due primarily to normal operational fatigue loading. These fatigue loads will impart a small resistance change to the material which could be trended over time and correlated with the fatigue life of the panel. Additional failure modes to the carbon and consequently panel performance may be attributed to exposure to the elements such as the sun, wind, rain, sleet, snow, and the like, and also exposure to environmental agents such as salt, chemicals, oils, dirt, and ice. These failure modes will have a different measurable characteristic to the normal lifetime response. Additionally, the ETH panel 302 may begin to fail due to external factors, such as lightning strikes, bird strikes, or contact with other ambient conditions. The failure of the ETH panel 302 affects de-icing and anti-icing processes leading to a collection of ice on the surface of the blade 108. Therefore, there is a need to detect when ETH panels 302 begin to fail.

Figure 5:
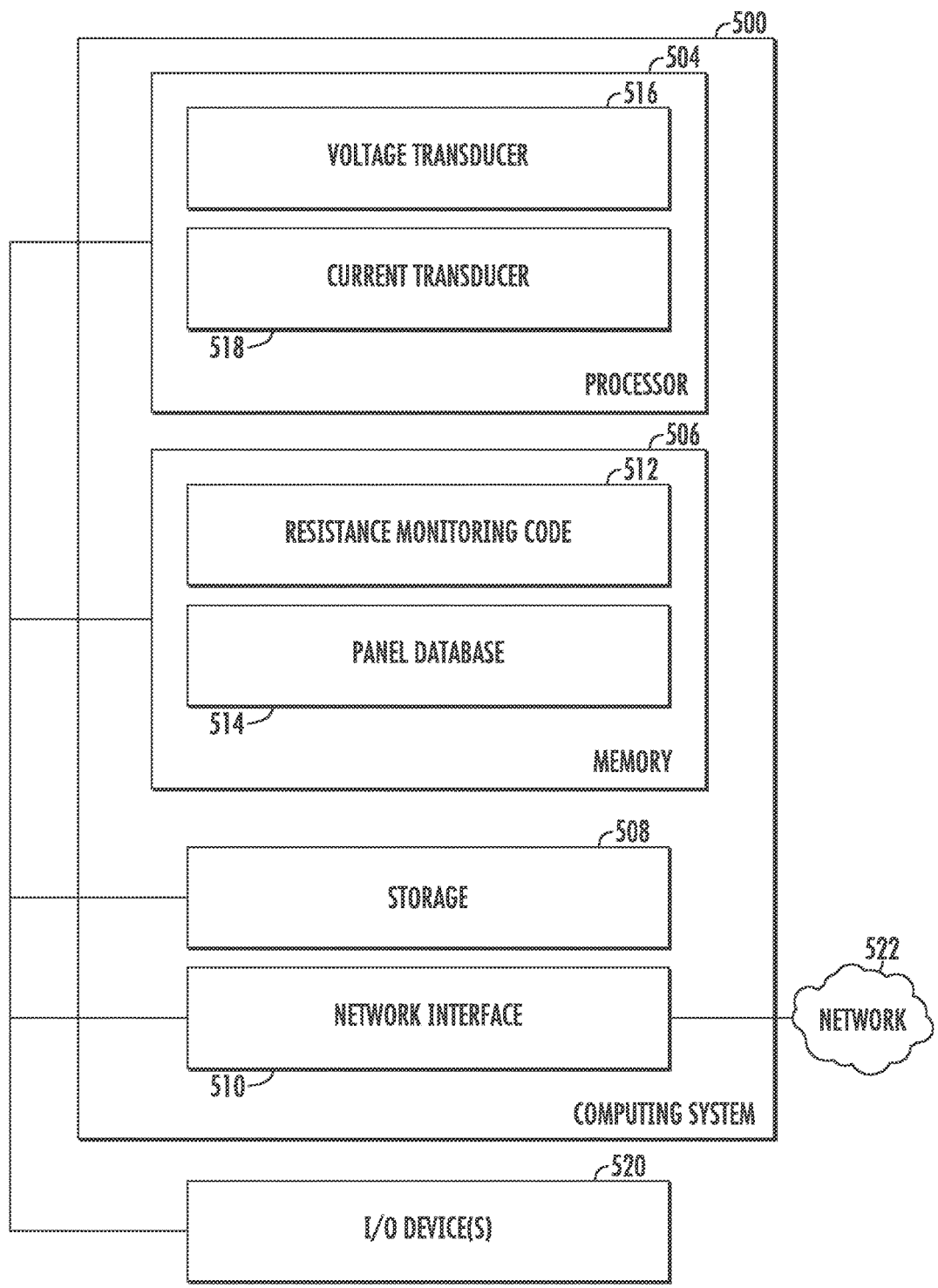
FIG. 5 illustrates one example of a computing system configured to carry out a method for monitoring and controlling a condition of a heating element in a wind turbine blade, according to one example.

FIG. 5 illustrates one example of a computing system 500, such as system controller 308, which is configured to carry out a method for monitoring and controlling a condition of a heating element, such as an ETH panel, in a wind turbine blade. The computing system 500 includes a processor 504, a memory 506, storage 508, and a network interface 510. The processor 504 is included to be representative of a single processor, multiple processors, a single processor having multiple processing cores, and the like. The storage 508 may be a hard disk drive or a solid state drive. Although shown as a single unit, the storage 508 may be a combination of fixed and/or removable storage devices, such as fixed drives, removable memory cards, optical storage, network attached storage (NAS), or storage-area-network (SAN). The network interface 510 may be any type of network communications allowing the computing system 500 to communicate with other computers via a network 522.

The computing system 500 also includes I/O devices 520 connected to the computing system 500. The I/O devices 520 may include a plurality of voltage transducers 516 and a plurality of current transducers 518. In one example, at least one voltage transducer 516 is in communication with the ETH panels. In another example, there is a plurality of voltage transducers 516, wherein each voltage transducer 516 is in communication with a respective ETH panel in the wind turbine blade. The voltage transducer 516 is configured to measure the voltage applied to its respective ETH panel. In one example, at least one current transducer 518 is in communication with the ETH panels. In another example, there is a plurality of current transducers 518, wherein each current transducer 518 is in communication with a respective ETH panel in the wind turbine blade. The current transducer 518 is configured to measure a current through its respective ETH panel.

The processor 504 is programmed to execute resistance monitoring code 512 stored in memory 506, which implements a method for monitoring and controlling a condition of an ETH panel in a wind turbine blade described below in conjunction with FIG. 6. The resistance monitoring code 512 includes a first component that measures a voltage applied to a ETH panel, a second component that measures a current through the ETH panel, a third component that calculates the resistance of the ETH panel, and a fourth component that stores the calculated resistance in panel database 514 stored in memory 506. The measured voltage and the measured current are used to calculate the resistance through the ETH panel. For example, the resistance may be calculated using Ohm's Law, $R=V/I$, where R represents the resistance, V represents the voltage, and I represents the current. The current through the ETH panel is inversely related to the resistance of the ETH panel because as voltage applied to the ETH panel remains the same, a decrease in resistance of the ETH panel will increase the current through the ETH panel. On the other hand, the voltage applied to the ETH panel is directly related to the current, because as the resistance through the ETH panel remains the same, an increase in the voltage applied to the ETH panel will increase the current of the ETH panel.

Figure 6:
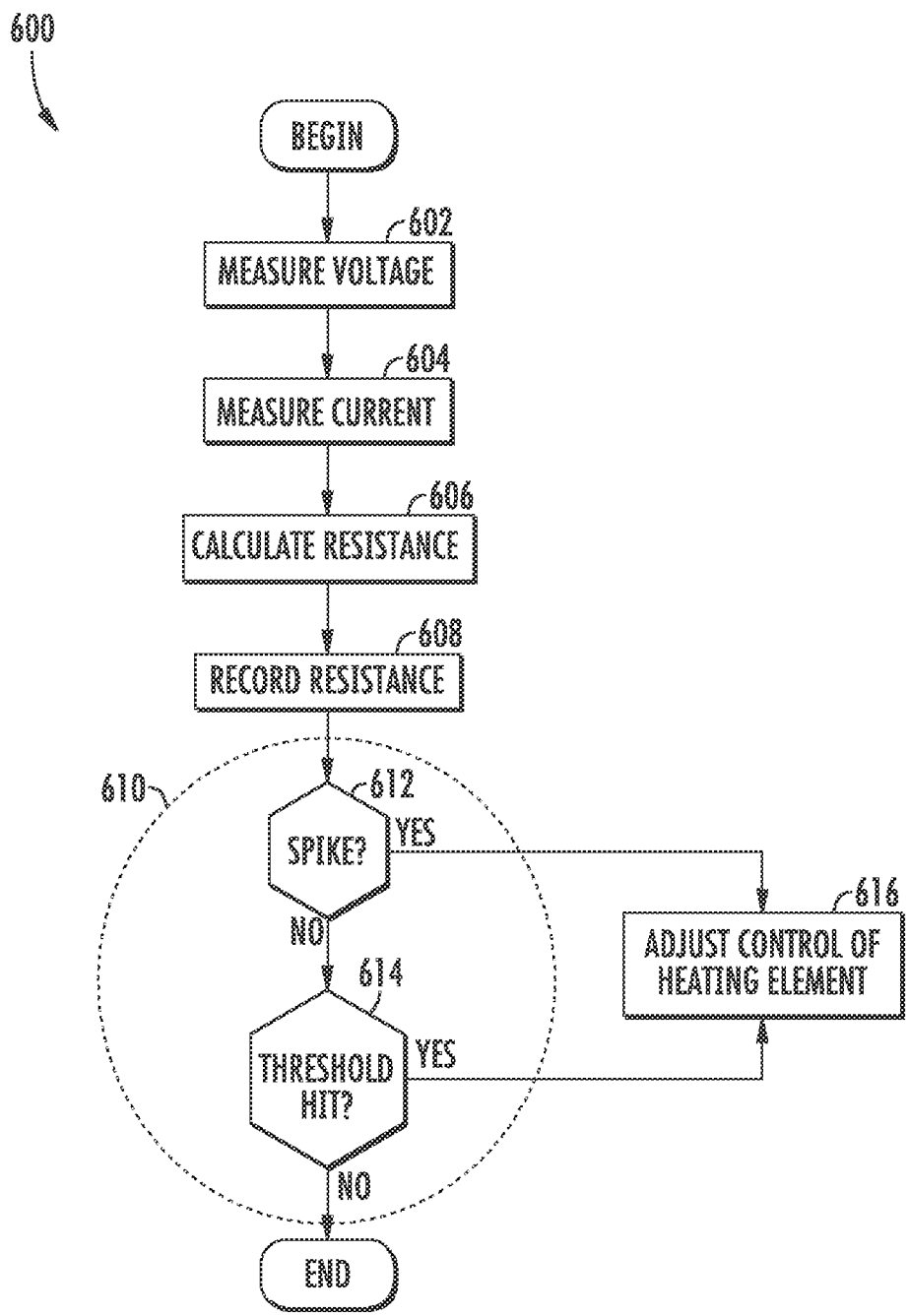
FIG. 6 is a flow diagram for monitoring and controlling a condition of a heating element in a wind turbine blade, according to one example.

FIG. 6 is a flow diagram of a method 600 for monitoring and controlling a condition of a heating element, such as ETH panel 302, in a wind turbine blade and the condition of the wind turbine blade. The method 600 begins at step 602.

At step 602, the voltage transducer measures the voltage applied to an ETH panel. The controller sends a signal to the voltage transducer that is in communication with the ETH panel to measure the voltage applied to the ETH panel.

At step 604, the current transducer measures the current through the ETH panel. The controller sends a signal to the current transducer that is in communication with the ETH panel to measure the current through the ETH panel.

At step 606, the controller calculates the resistance of the ETH panel. The controller uses the voltage measured in step 602 and the current measured in step 604 to calculate the resistance. For example, the resistance is calculated using Ohm's Law, $R=V/I$, where V represents the measured voltage, I represents the measured current, and R represents the calculated resistance.

Figure 7:
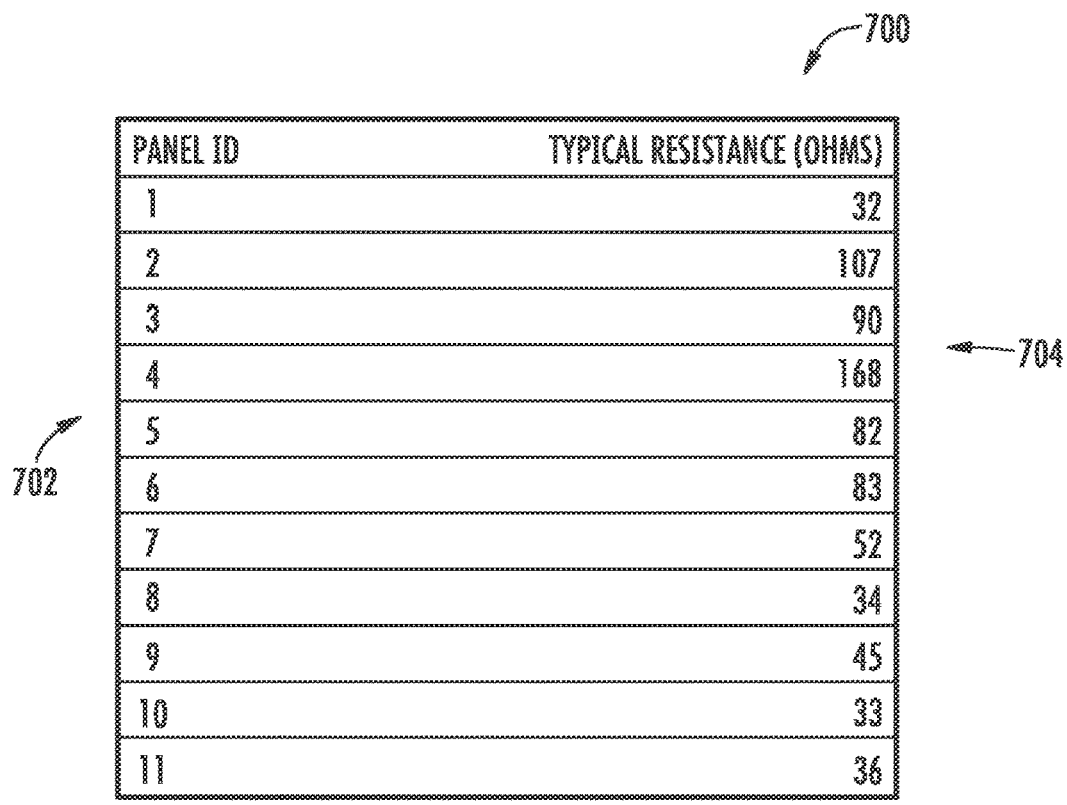
FIG. 7 illustrates a database storing typical resistance of several ETH panels, according to one example.

At step 608, the controller records the calculated resistance in the database, such as the panel database 514. The database stores calculated resistances of the ETH panel over a period of time so that the controller can detect events occurring in the database that correspond to degradation, or failure, of the ETH panel. FIG. 7 illustrates a database 700 storing typical resistance of several ETH panels, according to one example. The database 700 lists the panels 702 and their respective resistances 704 in Ohms. Referring back to FIG. 6, at step 612, the controller determines whether there is a spike in resistance in the ETH panel. A spike in resistance may correspond to a trauma event to the ETH panel caused by a lightning strike or other external condition contacting the blade housing the ETH panel. The controller determines if there is a spike in resistance by comparing the resistance at a current time, x, to the resistance at times x−1, x−2, . . . x−n, where x−n represents the first resistance measurement for the ETH panel. For example, a spike in resistance may be defined as a 5% increase in resistance between successive measurements. If there is a spike in resistance, then at step 616 the controller adjusts the control of the ETH panel. In one example, the controller may indicate to the user that the ETH panel requires service. In this example, the user may take additional steps to repair the ETH panel, alternate the ETH panel in the control loop, replace the heating element, and the like. In another example, the controller may take the ETH panel out of the control loop temporarily while the ETH panel requires service. In yet another example, the controller may take the ETH panel out of the control loop completely.

Figure 8:
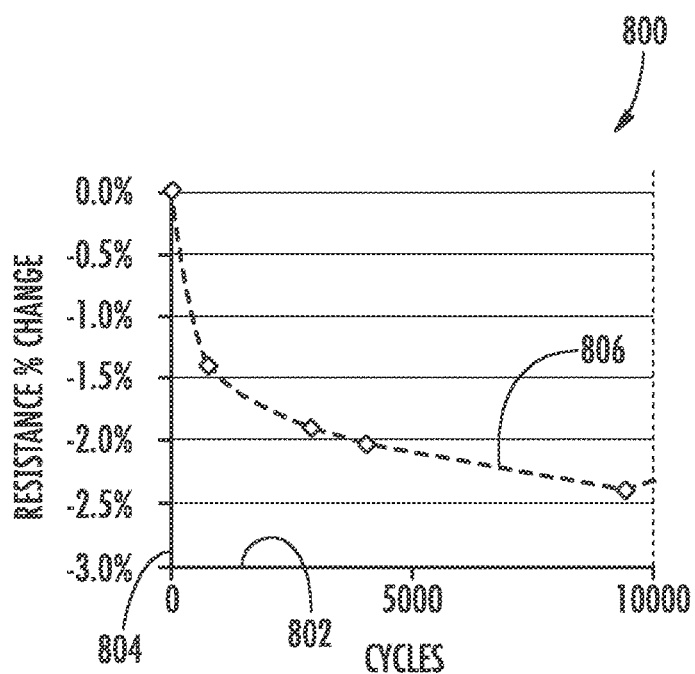
FIG. 8 illustrates a chart depicting the change in ETH panel resistance due to thermal cycling, according to one embodiment To facilitate understanding, identical reference numerals have been used, where possible, to designate identical elements that are common to the figures. It is contemplated that elements disclosed in one example may be beneficially utilized on other examples without specific recitation.

If there is not a spike in resistance, then at step 614 the controller determines whether the measured resistance gradually exceeds a threshold value. The gradual rise is resistance corresponds to fatigue of the ETH panel. The gradual rise in resistance may signal to the controller that the ETH panel is beginning to fail. The controller determines if the measured resistance gradually exceeds the threshold value by looking at the trend of previous resistance calculations. FIG. 8 illustrates a chart 800 depicting the change in ETH panel resistance due to thermal cycling, according to one embodiment. In chart 800, the number of cycles is measured along the x-axis 802 and the resistance percentage change in resistance along the y-axis 804. As the number of cycles increases, the resistance percentage change decreases, i.e., the panel begins to fatigue. This relationship creates a negative curve 806 depicting a gradual fatigue of the ETH panel. The threshold value defined in step 614 is a point below the curve 806.

Referring back to FIG. 6, if the calculated resistance does exceed the threshold value, then at step 616 the controller adjusts the control of the ETH panel. Steps 612 and 614 correspond to events 610 that may signal an adjustment of control of the heating elements.

If the calculated resistance does not gradually exceed a threshold value, then the method 600 is complete. The method 600 may be repeated for each individual ETH panel in the wind turbine blade. In one example, testing may occur during a specific period each day. For example, testing may occur for ten seconds each morning. In another example, the resistance may be calculated after a wind event to detect any change in a ETH panel that could indicate a fault with the ETH panel or the blade. Monitoring the condition of the ETH panel aids in increasing the life of the ETH panel. The calculated resistance may also be referenced with the wind conditions at the time of measurement to allow for normal operating conditions to be filtered out of the data.

In the preceding, reference is made to examples presented in this disclosure. However, the scope of the present disclosure is not limited to specific described examples. Instead, any combination of the preceding features and elements, whether related to different examples or not, is contemplated to implement and practice contemplated examples. Furthermore, although examples disclosed herein may achieve advantages over other possible solutions or over the prior art, whether or not a particular advantage is achieved by a given example is not limiting of the scope of the present disclosure. Thus, the preceding aspects, features, examples, and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the examples disclosed herein may be embodied as a system, method, or computer program product. Accordingly, aspects may take the form of an entirely hardware example, an entirely software example (including firmware, resident software, micro-code, etc.) or an example combining software and hardware aspects that may all generally be referred to herein as a "circuit," "module," or "system." Furthermore, aspects may take the form of a computer program product embodied in one or more computer readable medium(s) having computer readable program code embodied thereon. Program code embodied on a computer readable medium may be transmitted using any appropriate medium, including but not limited to wireless, wireline, optical fiber cable, RF, etc., or any suitable combination of the foregoing.

Aspects of the present disclosure are described above with reference to flowchart illustrations and/or block diagrams of methods, apparatus (systems), and computer program products according to examples presented in this disclosure. It will be understood that each block of the flowchart illustrations and/or block diagrams, and combinations of blocks in the flowchart illustrations and/or block diagrams, can be implemented by computer program instructions. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The flowchart and block diagrams in the Figures illustrate the architecture, functionality, and operation of possible implementations of systems, methods, and computer program products according to various examples. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

The invention claimed is:

1. A method of monitoring and controlling a condition of an electro-thermal heat panel in a wind turbine blade and the wind turbine blade, comprising:
   calculating a first resistance of the electro-thermal heat panel at a first time by measuring a first current or voltage applied to the electro-thermal heat panel at the first time;
   calculating, in response to determining a wind event occurred, a second resistance of the electro-thermal heat panel at a second time after the first time by measuring a second current or voltage applied to the electro-thermal heat panel at the second time;
   determining a percentage difference between the second resistance and the first resistance; and
   adjusting control of the electro-thermal heat panel in response to determining that the percentage difference is greater than a threshold.

2. The method of claim 1, wherein the percentage difference being greater than the threshold corresponds to thermal fatigue or mechanical fatigue of the electro-thermal heat panel.

3. The method of claim 1, further comprising storing the first resistance in a database.

4. The method of claim 1, wherein adjusting control of the electro-thermal heat panel comprises removing the electro-thermal heat panel from a control loop.

5. The method of claim 1, wherein adjusting control of the electro-thermal heat panel comprises servicing the electro-thermal heat panel.

6. The method of claim 1, wherein a current transducer measures a current flowing through the electro-thermal heat panel.

7. The method of claim 1, wherein a voltage transducer measures a voltage applied to the electro-thermal heat panel.

8. A system, comprising:
a processor; and
a memory storing program code, which, when executed on the processor performs an operation for monitoring and controlling a condition of an electro-thermal heat panel in a wind turbine blade and the wind turbine blade, the operation comprising:
- calculating a first resistance of the electro-thermal heat panel at a first time by measuring a first current or voltage applied to the electro-thermal heat panel at the first time;
- calculating, in response to determining a wind event occurred, a second resistance of the electro-thermal heat panel at a second time after the first time by measuring a second current or voltage applied to the electro-thermal heat panel at the second time;
- determining a percentage difference between the second resistance and the first resistance; and
- adjusting control of the electro-thermal heat panel in response to determining that the the percentage difference is greater than a threshold.

9. The system of claim 8, wherein the percentage difference being greater than the threshold corresponds to thermal fatigue or mechanical fatigue of the electro-thermal heat panel.

10. The system of claim 8, further comprising storing the first resistance in a database.

11. The system of claim 8, wherein adjusting control of the electro-thermal heat panel comprises removing the electro-thermal heat panel from a control loop.

12. The system of claim 8, wherein adjusting control of the electro-thermal heat panel comprises servicing the electro-thermal heat panel.

13. The system of claim 8, wherein a current transducer measures a current flowing through the electro-thermal heat panel.

14. The system of claim 8, wherein a voltage transducer measures a voltage applied to the electro-thermal heat panel.

15. A non-transitory computer readable storage medium having stored thereon instructions that, when executed by a processor, cause the processor to perform a condition monitoring and controlling operation of an electro-thermal heat panel in a wind turbine blade and the wind turbine blade, the operation comprising:
- calculating a first resistance of the electro-thermal heat panel at a first time by measuring a first current or voltage applied to the electro-thermal heat panel at the first time;
- calculating, in response to determining a wind event occurred, a second resistance of the electro-thermal heat panel at a second time after the first time by measuring a second current or voltage applied to the electro-thermal heat panel at the second time;
- determining a percentage difference between the second resistance and the first resistance; and
- adjusting control of the electro-thermal heat panel in response to determining that the percentage difference is greater than a threshold.

16. The computer readable storage medium of claim 15, wherein the percentage difference being greater than the threshold corresponds to thermal fatigue or mechanical fatigue of the electro-thermal heat panel.

17. The computer readable storage medium of claim 15, the operation further comprising storing the first resistance in a database.

18. The computer readable storage medium of claim 15, wherein adjusting control of the electro-thermal heat panel comprises removing the electro-thermal heat panel from a control loop.

19. The computer readable storage medium of claim 15, wherein adjusting control of the electro-thermal heat panel comprises servicing the electro-thermal heat panel.

20. The computer readable storage medium of claim 15, wherein a current transducer measures a current flowing through the electro-thermal heat panel.

* * * * *